(12) United States Patent
Kim et al.

(10) Patent No.: US 8,266,572 B2
(45) Date of Patent: Sep. 11, 2012

(54) METHOD FOR ACQUIRING OVERSHOOT VOLTAGE AND ANALYZING DEGRADATION OF A GATE INSULATION USING THE SAME

(75) Inventors: Sung-Soo Kim, Bucheon-si (KR);
Man-Young Shin, Seongnam-si (KR);
Jang-Hyuk An, Yongin-si (KR);
Sung-Eun Kim, Hwasung-si (KR);
Nam-Hyung Lee, Suwon-si (KR);
Yong-Sang Cho, Hwasung-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 379 days.

(21) Appl. No.: 12/585,948

(22) Filed: Sep. 29, 2009

(65) Prior Publication Data

US 2010/0088660 A1    Apr. 8, 2010

(30) Foreign Application Priority Data

Oct. 2, 2008 (KR) .................. 10-2008-0097096

(51) Int. Cl.
*G06F 17/50* (2006.01)
(52) U.S. Cl. ........................................ 716/136
(58) Field of Classification Search ............ 716/136
See application file for complete search history.

(56) References Cited

U.S. PATENT DOCUMENTS

| | | | |
|---|---|---|---|
| 5,594,349 A | 1/1997 | Kimura | |
| 5,796,985 A * | 8/1998 | O'Brien et al. | 716/113 |
| 6,766,274 B2 * | 7/2004 | Puthucode | 702/181 |
| 7,142,991 B2 * | 11/2006 | Hathaway et al. | 702/57 |
| 7,395,519 B2 * | 7/2008 | Kawata | 716/112 |
| 7,849,426 B2 * | 12/2010 | Goodnow et al. | 716/106 |
| 8,046,622 B2 * | 10/2011 | Lee | 713/500 |
| 8,050,901 B2 * | 11/2011 | Lin | 703/14 |
| 8,108,159 B2 * | 1/2012 | Yang et al. | 702/58 |
| 2005/0022141 A1 * | 1/2005 | Walker et al. | 716/2 |
| 2005/0286315 A1 * | 12/2005 | Mihnea et al. | 365/185.29 |
| 2006/0143586 A1 * | 6/2006 | Suaya et al. | 716/13 |
| 2007/0006104 A1 * | 1/2007 | Kawata | 716/4 |

(Continued)

FOREIGN PATENT DOCUMENTS

| | | |
|---|---|---|
| JP | 06-034704 A | 2/1994 |
| JP | 2000-058612 A | 2/2000 |
| KR | 10-2006-0091025 A | 8/2006 |

OTHER PUBLICATIONS

Li, Xiaojun et al., "A new spice reliability simulation method for deep submicrometer cmos vlsi circuits", Jun. 2006, IEEE, Transactions on device and meterials reliability, vol. 6, pp. 247-257.*

(Continued)

*Primary Examiner* — Stacy Whitmore
(74) *Attorney, Agent, or Firm* — Lee & Morse, P.C.

(57) ABSTRACT

A method of acquiring an overshoot voltage applied to a transistor includes determining a first extraction value, the first extraction value including a product of acceleration factors determined in a test of the transistor, determining an applied time, the applied time corresponding to a length of time a voltage deviates from a predetermined level of an input voltage in a circuit employing the transistor, determining a second extraction value by dividing the first extraction value by the applied time, and determining the overshoot voltage by multiplying the second extraction value by the input voltage.

6 Claims, 8 Drawing Sheets

U.S. PATENT DOCUMENTS

| | | | |
|---|---|---|---|
| 2009/0063061 A1* | 3/2009 | Bolam et al. | 702/58 |
| 2009/0082978 A1* | 3/2009 | Yang et al. | 702/58 |
| 2009/0113358 A1* | 4/2009 | Goodnow et al. | 716/4 |
| 2009/0280582 A1* | 11/2009 | Thijs et al. | 438/14 |
| 2010/0026364 A1* | 2/2010 | Shankar et al. | 327/333 |

OTHER PUBLICATIONS

Cadence, "Reliability simulation in integrated circuit design" White Paper, 2003. CADENCE, pp. 1-11.*

Liu, Zhihong et al., "Design tools for reliability analysis", Jul. 2006, ACM, 1-59593-381-6/6/0007. pp. 182-187.*

Mahapaptra, S. et al., "Defect generation in p-mosfets under negative-bias stress: an experimental perspective", Mar. 2008, IEEE, Transactions on device and materials reliability, vol. 8, pp. 35-46.*

McPherson, J.W., "Reliability trends with advanced cmos scaling and the implications for design", 2007, IEEE, Custom Integrated Circuits Conference (CICC), pp. 405-412.*

* cited by examiner

FIG.4

$$|V_{overshoot}| = |V_{in}| \times \left[ \frac{A_A \times A_T \times A_V \times 10 - (t_{lifetime} \times R_F) + t_{overshoot}}{t_{overshoot}} \right]^{1/N}$$

$$A_T = exp\left[ \frac{E_A}{8.62 \times 10^{-5}} \times \left( \frac{1}{273 + T_j} - \frac{1}{398} \right) \right]$$

$$A_T = \left[ \frac{Area\{mm^2\}}{A_{REF}} \right]^{\frac{-1}{B}}$$

$$A_T = \left[ \frac{|V_H|}{V_{REF}} \right]^{-N}$$

METHOD FOR ACQUIRING OVERSHOOT VOLTAGE AND ANALYZING DEGRADATION OF A GATE INSULATION USING THE SAME

BACKGROUND

1. Field

Example embodiments relate to a circuit designing method. More particularly, example embodiments relate to a method of acquiring an overshoot voltage induced by a voltage stress of an alternate component in a circuit design, and to a method of analyzing a degradation of a gate insulation using the same.

2. Description of the Related Art

Transistors may be subject to stress, e.g., stress caused by voltage applied thereto. When a transistor is subject to stress for a long time, reliability of the transistor may be reduced due to, e.g., a time dependent dielectric breakdown (TDDB) in a gate insulation layer therein. For example, attempts have been made to analyze reliability of a gate insulation layer of a transistor by analyzing degradation of the gate insulation layer as a result of voltage stress thereon via application of a direct current component to the transistor.

However, voltage stress of a direct current (DC) component is not appropriate to verify reliability of the gate insulation layer in a circuit design because the voltage stress of the DC component is simply proportionate to current and resistance and may not reflect different operation conditions of the transistor in various circuits.

SUMMARY

Example embodiments are therefore directed to a method of acquiring an overshoot voltage induced by a voltage stress of an alternate component in a circuit design and to a method of analyzing degradation of a gate insulation using the same, which substantially overcome one or more of the problems due to the limitations and disadvantages of the related art.

It is therefore a feature of an example embodiment to provide a method of determining an overshoot voltage induced by a voltage stress of an alternate component in a circuit design by determining deviation of voltage with an alternate component applied to a transistor in the circuit design from an input voltage.

It is another feature of an example embodiment to provide a method of analyzing reliability of a gate insulation layer using overshoot voltage determined based on a voltage stress of an alternate current component in a circuit design.

It is yet another feature of an example embodiment to provide a method of determining reliability of a gate insulation layer before completion of a product, thereby substantially increasing productivity.

At least one of the above and other features and advantages may be realized by providing a method of acquiring an overshoot voltage, including obtaining a first extraction value corresponding to a multiplication of acceleration factors obtained in a test of a transistor formed on a wafer, and then obtaining an applied time of a voltage deviated from a level of input voltage in a circuit employing the transistor, and thus obtaining a second extraction value by dividing the first extraction value by the applied time, and obtaining an overshoot voltage as a third extraction value obtained by multiplying the second extraction value by the input voltage.

The acceleration factors may include an area acceleration factor, a temperature acceleration factor and a voltage acceleration factor of a channel area in the transistor. The second extraction value may be a value obtained by adding an overshoot time to the first extraction value and then again dividing the added value by the overshoot time. The third extraction value may be proportionate to the (1/N)-th power of the second extraction value.

At least one of the above and other features and advantages may also be realized by providing a method of analyzing degradation of gate insulation layer of a transistor, including designing a circuit employing a transistor, acquiring an overshoot voltage by considering an applied time of the overshoot voltage deviated from a level of input voltage applied to the circuit, extracting an induced voltage induced between transistor formation areas having an interposition of gate insulation layer of the transistor therebetween in the circuit, and deciding as to whether to have defects in the circuit design by comparing the induced voltage with the overshoot voltage.

The induced voltage may include gate source voltage, gate drain voltage, and gate bulk voltage of the transistor. Determining whether the designed circuit includes defects may be performed before the designed circuit is formed on a wafer. Determining that the designed circuit does not include defects may include determining that the determined overshoot voltage is higher than the induced voltage. Designing the circuit, determining the overshoot voltage, extracting the induced voltage, and determining whether the designed circuit includes defects may be repeated until there are no defects in the designed circuit.

At least one of the above and other features and advantages may also be realized by providing a method of manufacturing a reliable circuit including at least one transistor, the method including designing a circuit with at least one transistor, performing reliability simulation on the at least one transistor in the circuit design by analyzing degradation of a gate insulation layer in the transistor, and forming the designed circuit with the at least one transistor on a wafer, after performing the reliability simulation, if the designed circuit includes substantially no defects, wherein performing the reliability simulation includes determining an overshoot voltage by measuring an applied time of the overshoot voltage, the applied time corresponding to a length of time a voltage deviates from a predetermined level of an input voltage in the designed circuit, extracting an induced voltage induced between transistor formation areas, the gate insulation being interposed between the transistor formation areas, and determining whether the designed circuit includes defects by comparing the induced voltage with the overshoot voltage. Designing the circuit may include modifying an initial circuit design, if the reliability simulation determines defects in the initial circuit design. The method may further include forming a plurality of the reliable circuits on the wafer.

BRIEF DESCRIPTION OF THE DRAWINGS

The above and other features and advantages will become more apparent to those of ordinary skill in the art by describing in detail example embodiments with reference to the attached drawings, in which:

FIG. 4 illustrates a numerical expression of overshoot voltage;

DETAILED DESCRIPTION OF THE INVENTION

Figure 1:
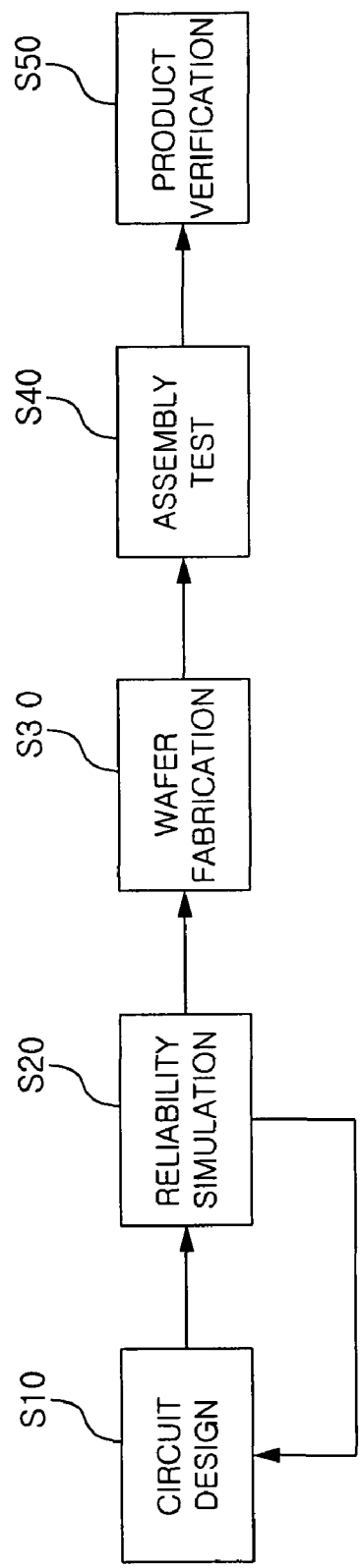
FIG. 1 illustrates a flowchart of a reliability verifying method according to an example embodiment.

Korean Patent Application No. 10-2008-0097096, filed on Oct. 2, 2008, in the Korean Intellectual Property Office, and entitled: "Method for Acquiring Overshoot Voltage and Analyzing Degradation of Gate Insulation Using the Same," is/incorporated by reference herein in its entirety.

A method of acquiring an overshoot voltage and a gate insulation layer degradation analysis method using the same are described in detail according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. Further, as used herein, the terms "a" and "an" are open terms that may be used in conjunction with singular items or with plural items.

FIG. 1 illustrates operations in a manufacturing method of a reliable circuit design according to an example embodiment. The manufacturing method may include reliability verification of a circuit.

As shown in FIG. 1, according to a reliability verifying method, a predetermined circuit design, e.g., a circuit including at least one transistor, may be formed in operation S10, followed by a reliability simulation of the circuit design, i.e., operation S20. Then, if the reliability simulation in operation S20 determines that the circuit design in operation S10 is proper, a circuit corresponding to the circuit design of operation S10 may be formed on a wafer during a wafer fabrication process, i.e., operation S30, prior to product verification, i.e., operation S50. The reliability verifying method according to example embodiments may enhance productivity by substantially reducing a defect occurrence during product verification, i.e., operation S50, by detecting defects in a gate insulation layer of the transistor in the circuit design through a reliability simulation in operation S20.

In particular, the reliability simulation, i.e., operation S20, may be based on voltage stress of an alternating current (AC) component induced in an operation of the circuit designed in operation S10. More particularly, in the reliability simulation, voltage stress of an AC component may be applied to the transistor in the circuit designed in operation S10, e.g., to each transistor of a plurality of transistors designed in the circuit, in order to evaluate the gate insulation layer of the transistor, e.g., determine defects in the gate insulation layer.

It is noted that voltage stress of AC components is used because the AC components may be mutually different depending on a disposition or a connection structure of the transistor. In other words, the voltage stress of an AC component may change according to an input voltage, time, and a peripheral environment that are determined by an actual operation of the circuit and a state of data storage. As an actual operation stress on a predetermined transistor may change with respect to, e.g., a circuit design, the varying voltage stress of the AC component may induce different overshoot voltages in accordance with the operation condition of the predetermined transistor. Thus, the gate insulation layer of the predetermined transistor may receive stress of respectively different levels. As such, mutually different reliability states among a plurality of transistors within a same circuit may be provided, e.g., with respect to different operating conditions. In contrast, use of voltage stress of the DC component may vary only according to Ohm's law, i.e., in proportion to current and resistance, without accounting to different operation conditions. Therefore, the reliability simulation in operation S20 may be performed by using voltage stress of an AC component in order to adequately reflect an actual operation condition of the circuit, thereby preventing a defect occurrence concerning reliability in the product verification of operation S50.

When the reliability simulation in operation S20 is complete and the circuit design formed in operation S10 is determined as proper, e.g., a circuit design having low reliability as determined by the reliability simulation in operation S20 may be discarded, the circuit design of operation S10 may be used to form a corresponding circuit on a wafer during the wafer fabrication, i.e., in operation S30. Once the circuit design is verified in operations S10 and S20, and a corresponding circuit is formed on the wafer in operation S30, the circuit on the wafer may be tested to verify proper electrical performance in a wafer level, i.e., an assembly test in operation S40. In operation S50, the wafer with the circuit thereon, e.g., a product after reliability and electrical verifications, may be verified, e.g., checked for defects. Since circuit design reliability is determined before wafer fabrication in operation S30, a number of defects, e.g., related to circuit reliability, in operation S50 may be substantially reduced, so manufacturing time and costs may be substantially reduced, while throughput may be substantially increased. The reliability simulation in operation S20 will be described in more detail below with reference to FIGS. 2-5.

Figure 2:
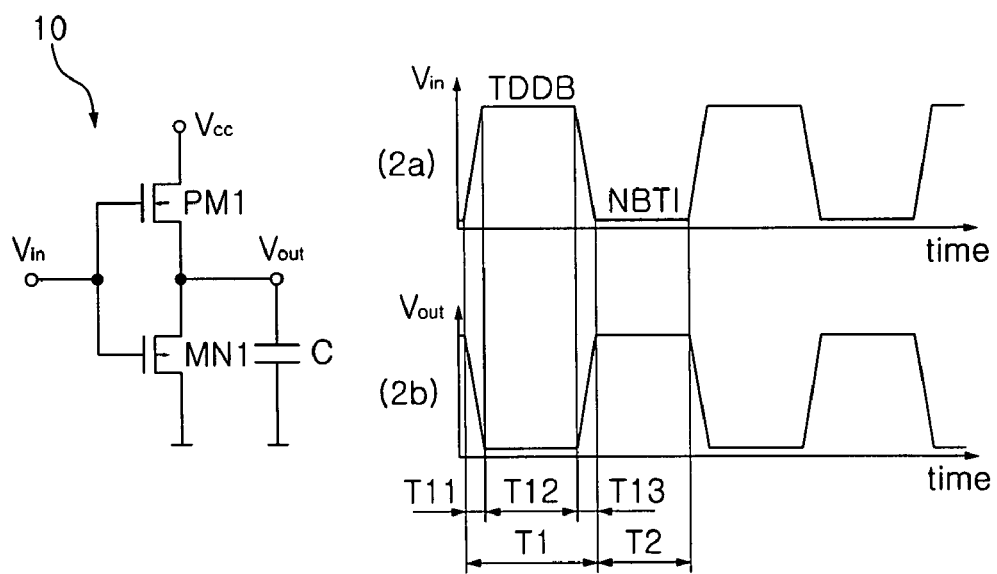
FIG. 2 illustrates voltage stress of an alternate current component in an operation of a circuit.
Figure 3:
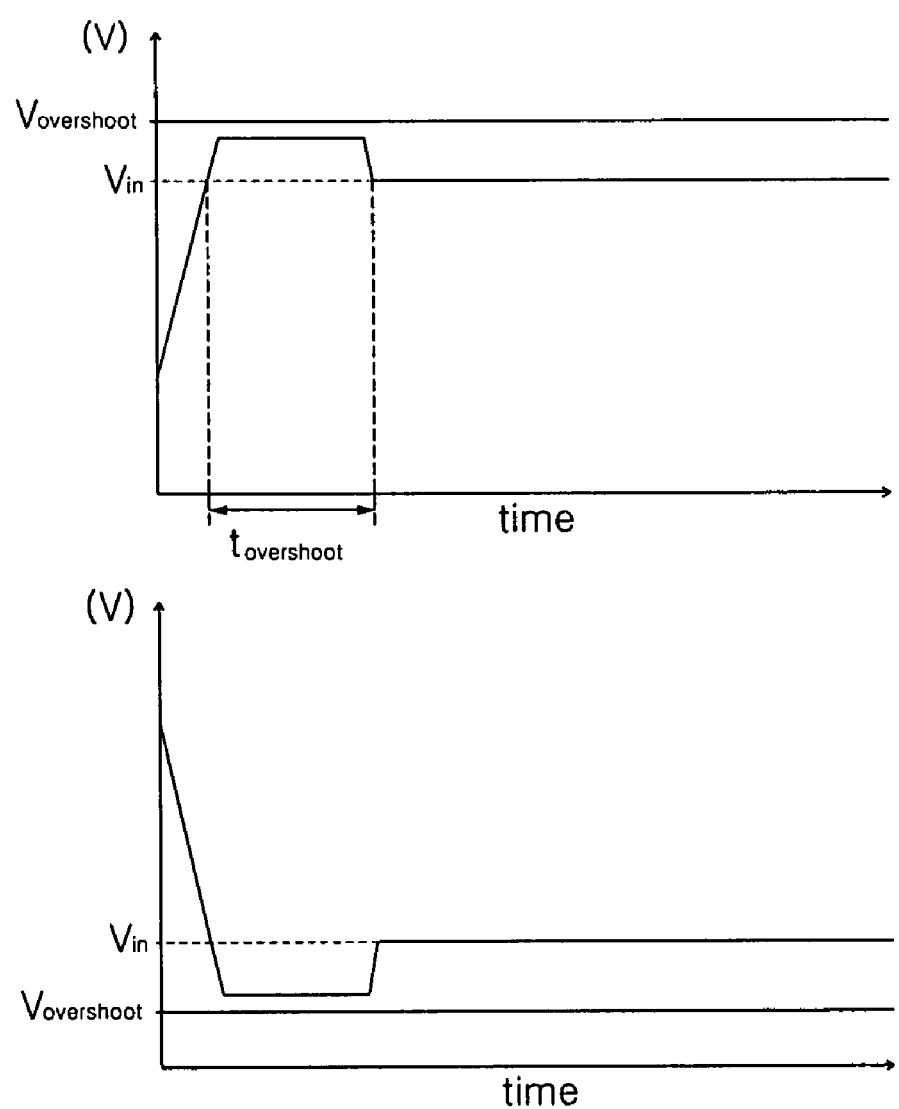
FIG. 3 illustrates graphs of overshoot and undershoot voltages triggered by the voltage stress of FIG. 2, respectively, and corresponding application time.

FIG. 2 illustrates voltage stress of an AC component in an operation of the circuit. FIG. 3 illustrates graphs of overshoot and undershoot voltages triggered by the voltage stress of FIG. 2, respectively, and corresponding application time.

Referring to FIG. 2, the AC component may be applied to the predetermined transistor in the circuit via an inverter 10. In particular, the inverter 10 may include a P-type transistor PM1 and an N-type transistor NM1. When a waveform 2a as a voltage stress of AC components is applied to the input terminal $V_{in}$ coupled in common to gates of the PMOS transistor PM1 and the NMOS transistor NM1, a waveform 2b may be output from the inverter 10, i.e., via output terminal $V_{out}$ positioned at a connection point of drains of the PMOS transistor PM1 and the NMOS transistor NM1.

In more detail, when a given level of input voltage $V_{in}$ is applied to a section T1 of the waveform 2a, the NMOS transistor NM1 is turned on, providing a hot carrier injection (HCI) characteristic at a section T11 and a time dependent dielectrics breakdown (TDDB) characteristic at a section T12. The TDDB characteristic reflects a length of time that a dielectric layer, e.g., the gate insulation layer in the transistor, loses its insulating properties during application of a predetermined voltage thereto, and may be evaluated to determine reliability of the gate insulation layer, i.e., the transistor and the circuit design including the same. Thus, the TDDB characteristic may be obtained by detecting the section T12 during the reliability simulation of the circuit designed in operation S10 based on voltage stress of an AC component.

As further illustrated in FIG. 2, a negative bias temperature instability (NBTI) characteristic appears in sections of T13 and T2 when the PMOS transistor PM1 is turned on. The NBTI characteristic and the HCI characteristic may be reflected via any suitable algorithm and may not act as a variable in a degradation analysis of the gate insulation layer in example embodiments.

The TDDB characteristic may be determined by voltage stress of an AC component applied to the gate insulation layer in the transistor. In other words, the gate insulation layer in the transistor may continuously degrade over time by a voltage stress of an AC component applied thereto. As described above, the TDDB characteristic may be closely related to a level of the input voltage $V_{in}$ applied to the transistor and to a length of time the input voltage $V_{in}$ is being applied.

An overshoot voltage or an undershoot voltage indicates that the input voltage $V_{in}$ input to the circuit, e.g., i.e., applied to the transistor, deviates from a predetermined level within the circuit. For example, the "overshoot" voltage may refer to a portion of the input voltage $V_{in}$ signal, e.g., an initial edge of the signal, that temporarily exceeds the predetermined level of the input voltage $V_{in}$. A length of time, i.e., duration, of the overshoot or undershoot voltage may refer to time that the overshoot voltage or undershoot voltage is applied to the transistor.

FIG. 3 illustrates graphs of overshoot/undershoot voltage and respective applied times. The overshoot/undershoot voltages $V_{overshoot}$ generally have a substantially same or similar magnitude of absolute value and, therefore, will both be referred to as an overshoot voltage $V_{overshoot}$ for convenience. The applied time $t_{overshoot}$ of the overshoot voltage $V_{overshoot}$ denotes a period of time that the overshoot voltage $V_{overshoot}$ deviates from the level of the input voltage $V_{in}$. For example, when a range of the input voltage $V_{in}$ applied to the circuit is about (−1) V to about 1 V, the overshoot voltage $V_{overshoot}$ refers to voltage exceeding about 1 V, the undershoot voltage $V_{overshoot}$ refers to voltage below about (−1) V, and the applied time $t_{overshoot}$ refers to a length of time, e.g., that the overshoot voltage $V_{overshoot}$ exceeds about 1 V. The overshoot voltage $V_{overshoot}$ may be a voltage applied to the NMOS transistor NM1, and the undershoot voltage $V_{overshoot}$ may be a voltage applied to PMOS transistor PM1, according to a sort of the transistor within the circuit. The overshoot voltage $V_{overshoot}$ may be determined based on the input voltage $V_{in}$ applied to the transistor and on the operation conditions of the transistor in the circuit. Determination of the overshoot voltage $V_{overshoot}$ according to example embodiments will be described in more detail below with reference to FIG. 4.

FIG. 4 illustrates a numerical expression of the overshoot voltage V overshoot. As illustrated in FIG. 4, the overshoot voltage $V_{overshoot}$ may be dependent on the input voltage $V_{in}$ applied to the circuit including the transistor, on the applied time $t_{overshoot}$ of the overshoot voltage $V_{overshoot}$, and on acceleration factors $A_T$, $A_A$ and $A_V$ determined in a test of the transistor. For example, the overshoot voltage $V_{overshoot}$ may be proportional to the input voltage $V_{in}$, and may be inversely proportional to the applied time $t_{overshoot}$ of the overshoot voltage $V_{overshoot}$. Further, the overshoot voltage $V_{overshoot}$ may be proportional to acceleration factors $A_T$, $A_A$ and $A_V$ determined in the test of the transistor.

The acceleration factors $A_T$, $A_A$, $A_V$ may reflect specific characteristics of the transistor in the circuit with respect to the operation condition of the transistor, e.g., to provide a guaranteed lifespan of the transistor until the performance of the transistor is finished, and an environment to which the transistor is exposed during its operation. The acceleration factors $A_T$, $A_A$, $A_V$ may be determined during a test of the transistor that evaluates the transistor performance. The test may be performed at more severe conditions and more accelerated states as compared with a regular operation of the transistor, e.g., in terms of applied voltage, temperature, energy $E_A$, etc. Thus, e.g., the test of the transistor may be performed before operation S20, so values of the acceleration factors $A_T$, $A_A$, $A_V$ may be determined before the operation S20. The test conditions may be designed to detect a stress factor applied to the transistor and to ensure reliability of a corresponding transistor for clients in acquiring the overshoot voltage $V_{overshoot}$.

For example, the acceleration factors $A_T$, $A_A$, and $A_V$ may be a temperature acceleration factor $A_T$, an area acceleration factor $A_A$, and a voltage acceleration factor $A_V$. The temperature acceleration factor $A_T$ may be determined by determining temperature $T_j$ and energy $E_A$ to which the transistor is exposed in the test and evaluating a corresponding relation expression of $T_j$ and $E_A$. The area acceleration factor $A_A$ may be determined by measuring a size of a flat area of a channel area of the transistor. The voltage acceleration factor $A_V$ may be determined from a relationship between a high voltage $V_H$ applied to the transistor and a predetermined reference voltage $V_{REF}$.

For example, the acceleration factors $A_T$, $A_A$, $A_V$ may be acquired by employing in the test of the transistor, i.e., the at least one transistor in the circuit designed in operation S10 of FIG. 1, substantially same test conditions as those of a general reference transistor. The temperature acceleration factor $A_T$ may be an exponential function of energy $E_A$ at a predetermined reference temperature 125° C., i.e., in units of eV, and the test temperature $T_j$, i.e., in degrees Celsius, while the temperature values are expressed as absolute temperature in degrees Kelvin, i.e., temperatures of ($T_j$+273) and (125° C.+273=398 K) in FIG. 4. The area acceleration factor $A_A$ may be proportional to the (−1/B)-th power of a channel area Area [mm$^2$] of the transistor being tested over a channel area $A_{REF}$ of the reference transistor. Similarly, the voltage acceleration factor $A_V$ may be proportional to the (−N)-th power of the high voltage $V_H$ applied to the transistor being tested over the reference voltage $V_{REF}$.

It is noted that even though not shown in FIG. 4, the voltage acceleration factor $A_V$ may be represented as an exponential function of the high voltage $V_H$-over-reference voltage $V_{REF}$. In this case, the overshoot voltage $V_{overshoot}$ may be determined through a specific numerical formula as a sum of the input voltage $V_{in}$ and a logarithmic function of the acceleration factors $A_T$, $A_A$, and $A_V$. Here, a constant 1/g may be multiplied by the logarithmic function of the acceleration factors $A_T$, $A_A$, and $A_V$.

As described above, the acceleration factors $A_T$, $A_A$, and $A_V$ may reflect a value acting as the stress applied to the transistor during testing within a reduced time with operation condition of the guaranteed lifespan. Therefore, a product of the acceleration factors $A_T$, $A_A$ and $A_V$, i.e., multiplication of the acceleration factors $A_T$, $A_A$ and $A_V$, may be proportional to a voltage stress of AC component applied to the transistor, and may correspond to a first extraction value obtained during testing of the transistor, e.g., the extraction value may refer to a process of determining the values of the acceleration factors $A_T$, $A_A$ and $A_V$ algorithmically or by measurement. The first extraction value may be acquired before the second extraction value. In the first extraction value, as illustrated in FIG. 4, the number 10 is a multiplier corresponding to a lifespan of a conventional transistor, $t_{lifetime}$ corresponds to a guaranteed use time of a transistor as required by a client in units of years, and $R_F$ correspond to time rating, i.e., a fraction reflecting a total time of application of the input voltage $V_{in}$ relative to the lifespan of the conventional transistor. For example, $R_F$ may be 0.5 when the input voltage $V_{in}$ is applied for 5 years among 10 years.

When the first extraction value obtained from the test condition of the transistor is acquired, the second extraction value may be acquired by using the applied time $t_{overshoot}$ of the overshoot voltage $V_{overshoot}$, e.g., the applied time $t_{overshoot}$ may be measured during the reliability simulation in operation S20 after the circuit design. The second extraction value may be obtained by determining a sum of the applied time $t_{overshoot}$ and the first extraction value, and then dividing the sum by the applied time $t_{overshoot}$. As such, the logarithm of the absolute value of the overshoot voltage $V_{overshoot}$ over the input voltage $V_{in}$ may be proportional to the second extraction value and a constant 1/N. Therefore, the overshoot voltage $V_{overshoot}$ may be proportional to the (1/N)-th power of the second extraction value, thus the logarithm of the second extraction value may be proportional to N and the overshoot voltage $V_{overshoot}$. At this time, when N equals '1', the overshoot voltage $V_{overshoot}$ may be proportional to the second extraction value.

Subsequently, the overshoot voltage $V_{overshoot}$, i.e., a third extraction value, may be obtained by multiplying the second extraction value by the input voltage $V_{in}$ applied to the circuit.

Therefore, the method of acquiring the overshoot voltage $V_{overshoot}$ according to an example embodiment may include determining the acceleration factors $A_T$, $A_A$ and $A_V$ of the transistor in the designed circuit, measuring the applied time $t_{overshoot}$, and calculating the overshoot voltage $V_{overshoot}$ with respect to the determined acceleration factors $A_T$, $A_A$ and $A_V$ and applied time $t_{overshoot}$. That is, setting a product of the acceleration factors $A_T$, $A_A$ and $A_V$ determined during testing of the transistor as a first extraction value, dividing the first extraction value by the applied time $t_{overshoot}$ of the overshoot voltage $V_{overshoot}$ to determine a second extraction value, and then determining a third extraction value, i.e., the overshoot voltage $V_{overshoot}$ by multiplying the second extraction value by the input voltage $V_{in}$ applied to the circuit.

Figure 5:
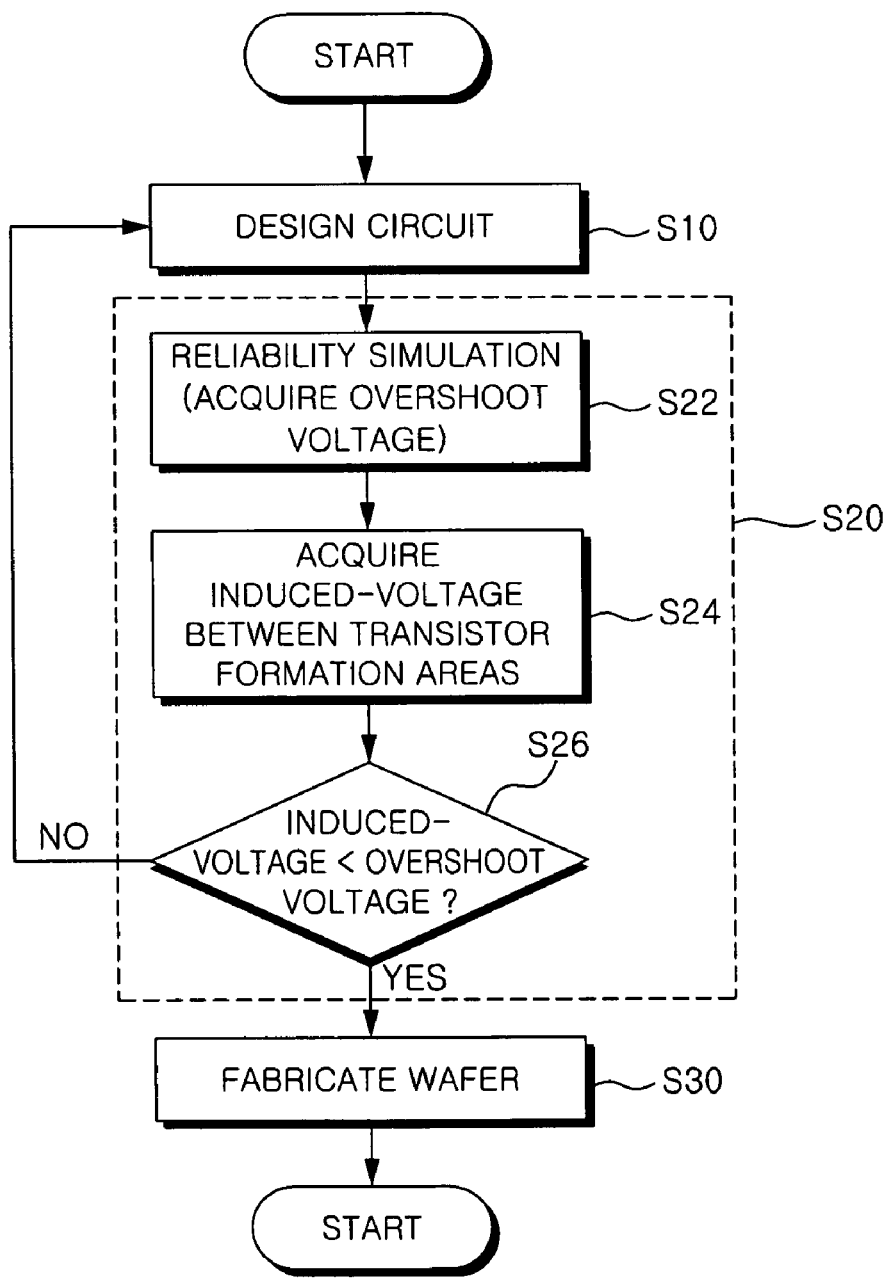
FIG. 5 illustrates a flowchart of a method of analyzing degradation of a gate insulation layer according to an example embodiment.

A degradation analysis method of the gate insulation layer in the transistor using the overshoot voltage $V_{overshoot}$ acquired according to example embodiments will be described with reference to FIG. 5. FIG. 5 illustrates a flowchart of a method of analyzing a degradation of a gate insulation layer according to an embodiment.

As illustrated in FIG. 5, a circuit may be designed in operation S10 to employ at least one transistor, e.g., the circuit may include a plurality of transistors of different types. In a plurality of transistors designed within the circuit, a type and a thickness of a gate insulation layer formed between a gate electrode and a respective channel may be decided, e.g., by an applied voltage magnitude. Subsequently, as discussed previously with reference to FIG. 1, a reliability simulation of the circuit may be performed in operation S20 in order to determine reliability of the gate insulation layers in the transistors.

In detail, as illustrated in FIG. 5, the reliability simulation may be performed in operation S22 to acquire the overshoot voltage $V_{overshoot}$ applied to a corresponding transistor for a reliability verification of the circuit, e.g., the overshoot voltage $V_{overshoot}$ of each transistor of the plurality of transistors in the circuit. The overshoot voltage $V_{overshoot}$ may be acquired according to the method discussed previously. Since application of a continuous stress of a given level to the transistor may generate a defect therein, e.g., degradation of the gate insulation layer due to voltage stress of an AC component, the overshoot voltage $V_{overshoot}$ may be employed as voltage stress of the AC component for analyzing degradation of the gate insulation layer according to an embodiment.

As described previously, the overshoot voltage $V_{overshoot}$ may depend on the input voltage $V_{in}$ input to the circuit and the applied time $t_{overshoot}$ the overshoot voltage $V_{overshoot}$ is deviating from a predetermined level of the input voltage $V_{in}$. For example, the applied time $t_{overshoot}$ of the overshoot voltage $V_{overshoot}$ may be obtained by simulating an operation of a corresponding circuit through a general-use system module. Prior to that, the acceleration factors $A_T$, $A_A$, and $A_V$ may be determined via a test corresponding to a performance test of the corresponding transistor. The method of acquiring the overshoot voltage $V_{overshoot}$ is described above in more detail with reference to FIG. 4.

Accordingly, in a method of analyzing a degradation of a gate insulation layer according to an embodiment, information for voltage stress of the AC component applied to a transistor designed in the circuit may be acquired by obtaining the overshoot voltage $V_{overshoot}$ through the reliability simulation in operation S22. Then, voltages $V_{GS}$, $V_{GD}$, $V_{GB}$ induced between transistor formation areas may be acquired in an operation S24, i.e., the gate insulation layer may be interposed between the formation areas of the transistor therebetween as will be described in more detail below with reference to FIG. 6. Here, the induced voltages $V_{GS}$, $V_{GD}$, $V_{GB}$ refer to voltages in a transistor of a circuit having a normal operation, and correspond to voltages induced between the gate electrode and respective elements insulated from each other through the gate insulation layer.

Figure 6:
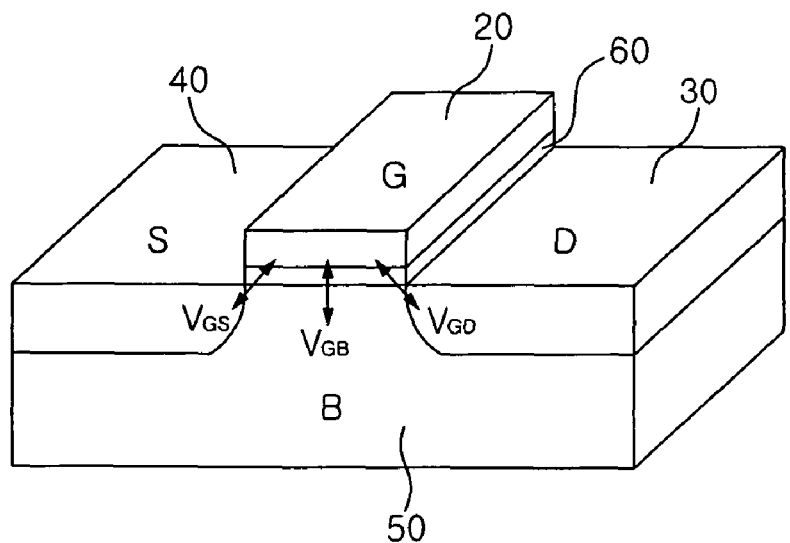
FIG. 6 illustrates voltage induced between transistor formation areas.

FIG. 6 illustrates the induced voltage $V_{GS}$, $V_{GD}$, $V_{GB}$ between transistor formation areas. As illustrated in FIG. 6, the induced voltage $V_{GS}$, $V_{GD}$, $V_{GB}$ refer to a gate-source voltage $V_{GS}$ between a gate electrode 20 and a source area 40 with a gate insulation layer 60 therebetween, a gate-drain voltage $V_{GD}$ between the gate electrode 20 and a drain area 30 with the gate insulation layer 60 therebetween, and a gate-bulk voltage $V_{GB}$ between the gate electrode 20 and a bulk 50 with the gate insulation layer 60 therebetween. For example, the induced voltages $V_{GS}$, $V_{GD}$, $V_{GB}$ induced between the transistor formation areas may be obtained through a general-use system, e.g., Hsim, Hspice, spectre, etc.

Once the induced voltages $V_{GS}$, $V_{GD}$, $V_{GB}$ are determined, reliability for the gate insulation layer 60 of the transistor within the circuit may be determined in operation S26 shown in FIG. 5. In particular, in operation S26, the induced voltage $V_{GS}$, $V_{GD}$, $V_{GB}$ determined in operation S24 may be compared with the overshoot voltage $V_{overshoot}$ determined in operation S22. When the induced voltage $V_{GS}$, $V_{GD}$, $V_{GB}$ is lower than the overshoot voltage $V_{overshoot}$, it may be decided that the transistor has a normal operation within the circuit, i.e., the circuit design may be applied to the wafer in the wafer fabrication operation S30. On the other hand, when the induced voltage $V_{GS}$, $V_{GD}$, $V_{GB}$ is higher than the overshoot voltage $V_{overshoot}$, it may be decided that the transistor has an abnormal operation, i.e., a design circuit in operation S10 may be repeated to design a new circuit. Operations S10 and S20 may be repeated until the transistor has a normal operation with the circuit design formed in operation S10. Though not shown in the drawing, the induced voltage $V_{GS}$, $V_{GD}$, $V_{GB}$ and the overshoot voltage $V_{overshoot}$ may be described as an absolute value.

Accordingly, in a gate insulation layer degradation analysis method according to an embodiment, a defect occurrence in the reliability for the gate insulation layer 60 may be detected through a reliability simulation in operation S20 after the circuit design in operation S10 and before the wafer fabrication in operation S30. Therefore, productivity may be increased.

Figure 7:
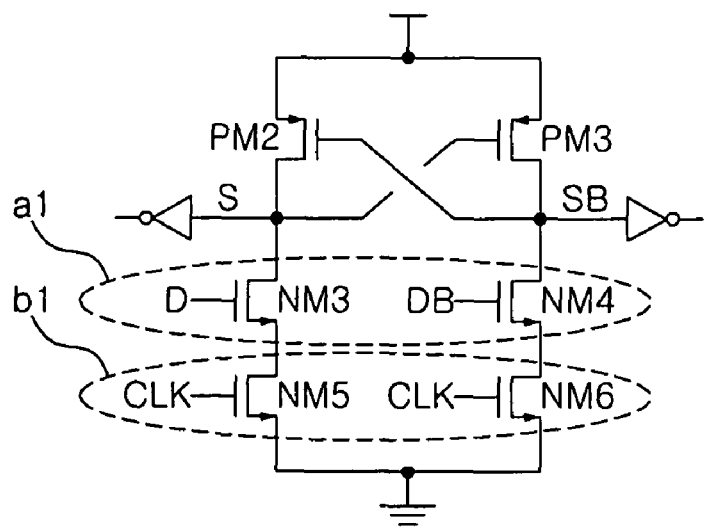
FIGS. 7 and 8 illustrate a modified example of cross-coupled differential amplifier circuit having a defect occurrence through a reliability simulation.
Figure 8:
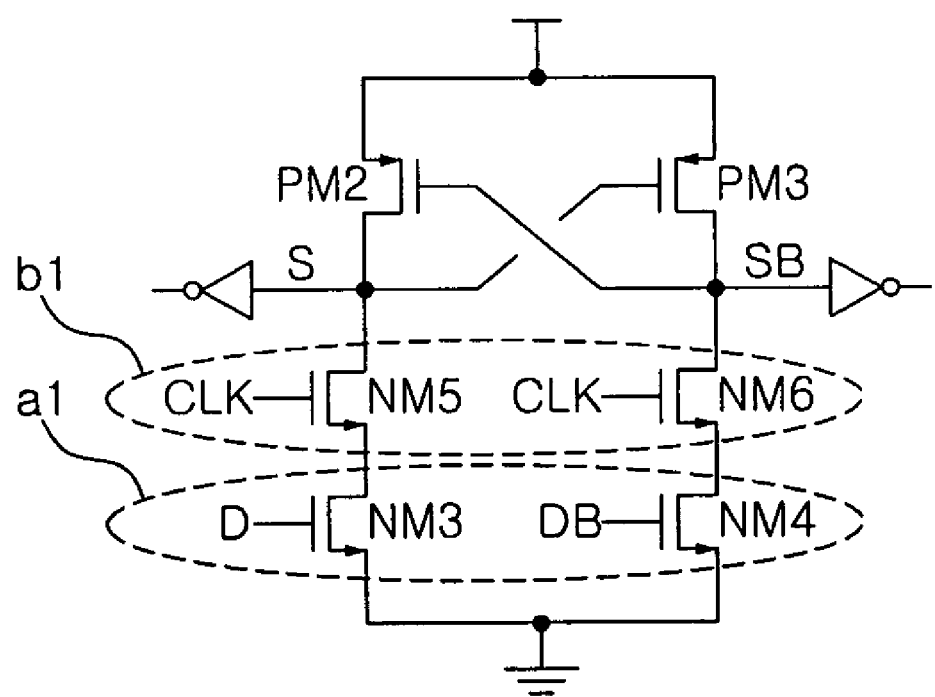
Figure 9:
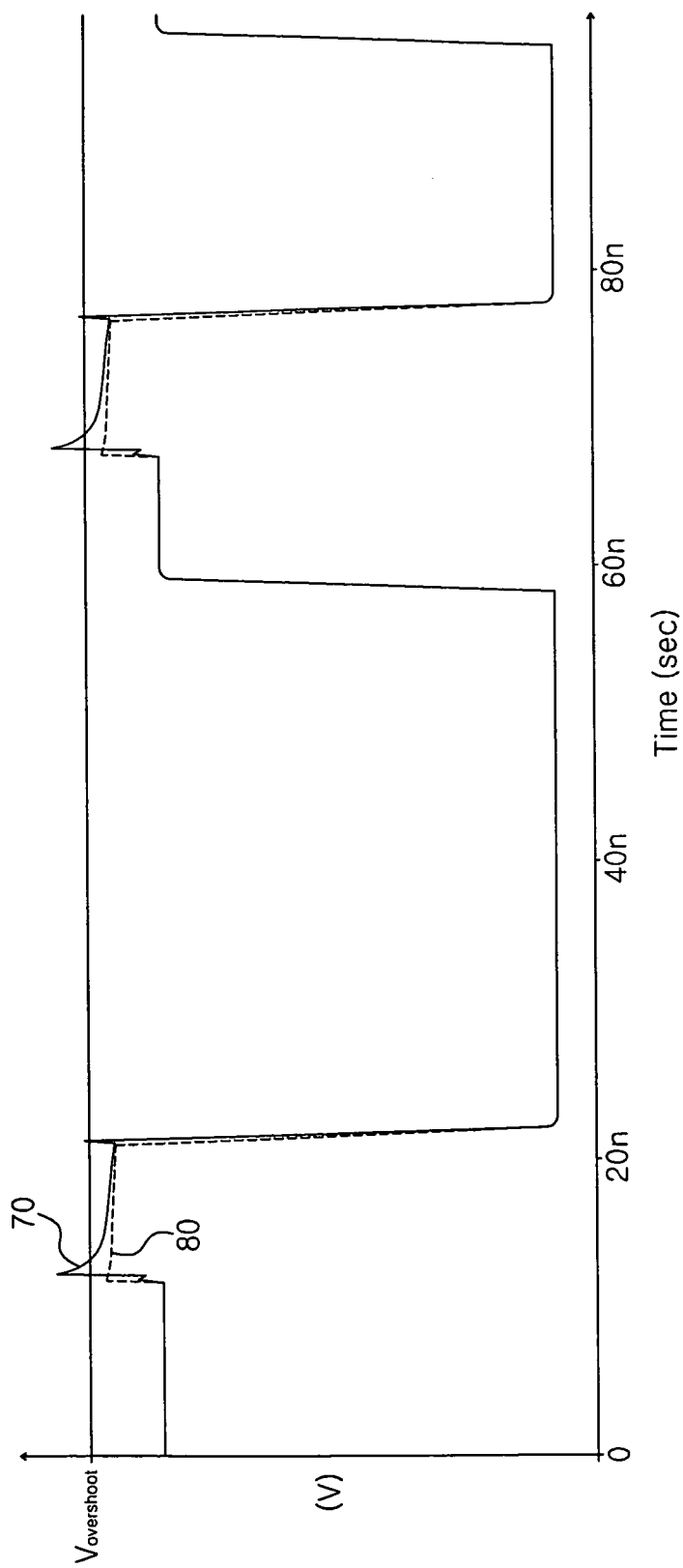
FIG. 9 illustrates a graph of an overshoot voltage generated in a data input terminal of the cross-coupled differential amplifier circuit referred to in FIGS. 7 and 8.

FIGS. 7 and 8 illustrate a modified example of a cross-coupled differential amplifier circuit having a defect occurrence through the reliability simulation S20. FIG. 9 illustrates a graph of an overshoot voltage $V_{overshoot}$ generated in data input terminals D and DB of the cross-coupled differential amplifier circuit in FIGS. 7 and 8.

For example, when a circuit is designed in operation S10 to have a data input terminals D and DB of a transistor unit a1 near respective data output terminals S and SB in the cross-coupled differential amplifier circuit, as illustrated in FIG. 7, a first gate-bulk voltage 70 may be induced between the bulk 50 and the gate electrode 20 of a plurality of NMOS transistors NM3 and NM4 of the data input transistor unit a1, as illustrated in FIG. 9. Since the first gate-bulk voltage 70 is higher than the overshoot voltage $V_{overshoot}$, as further illustrated in FIG. 9 and determined in operation S26, the cross-coupled differential amplifier circuit of FIG. 7 may be determined as having an abnormal operation. Therefore, the gate insulation layer 60 of the circuit design of FIG. 7 may be determined as defective and discarded.

In another example, when a circuit is designed in operation S10 to have a clock transistor unit b1 between the data input transistor unit a1 and the data output terminal S and SB, as illustrated in FIG. 8, a second gate-bulk voltage 80 may be induced between the bulk 50 and the gate electrode 20 of a plurality of NMOS transistors NM3 and NM4 of the data input transistor unit a1, as illustrated in FIG. 9. Since the second gate-bulk voltage 80 is lower than the overshoot voltage $V_{overshoot}$, as further illustrated in FIG. 9 and determined in operation S26, the cross-coupled differential amplifier circuit of FIG. 8 may be determined as having a normal operation for the guaranteed life. Therefore, the gate insulation layer 60 of the circuit design of FIG. 8 may be formed on a wafer in operation S30, i.e., it may be determined that the gate insulation layer 60 of the plurality of NMOS transistors NM3 and NM4 in the circuit of FIG. 9 may have a substantially lower degradation rate than the gate insulation layer in the circuit of FIG. 7.

Accordingly, a reliability result of the gate insulation layer 60 may be different depending on a position of the data input transistor unit a1 including a plurality of transistors having the gate insulation layer 60 of the same thickness within the circuit. In the cross-coupled differential amplifier circuit, as illustrated in FIG. 9, the first gate bulk voltage 70 was provided excessively for an applied time $t_{overshoot}$ of from about 12 nsec to about 22 nsec or from about 68 nsec to about 78 nsec. As further illustrated in FIG. 9, the second gate-bulk voltage 80 was provided at a stabilized state at a predetermined level.

When in FIG. 7, the first gate-bulk voltage 70 is induced to have a level of the overshoot voltage $V_{overshoot}$ or higher in the plurality of NMOS transistors NM3 and NM4 of the data input transistor unit a1, an induced voltage of an undershoot voltage level or below, lower than the input voltage $V_{in}$, may be generated in a plurality of PMOS transistors PM2 and PM3 of a latch type. To the contrary, when in FIG. 8, the second gate-bulk voltage 80 is induced to have a level of the over-shoot voltage $V_{overshoot}$ or lower in the NMOS transistor NM3, NM4 of the data input transistor unit a1, a stabilized induced voltage of an undershoot voltage level or higher, higher than the input voltage $V_{in}$, may be generated in the plurality of PMOS transistors PM2 and PM3 of the latch type.

Accordingly, in a method of analyzing a degradation of a gate insulation layer according to an embodiment, a reliability simulation to detect a reliability of a gate insulation layer may include acquiring an overshoot voltage applied to a plurality of transistors with a circuit design and comparing it with an induced voltage induced between transistor formation areas, thereby deciding a defect of transistors before a wafer fabrication.

Further, a recording medium that converts the method of acquiring an overshoot voltage induced by a voltage stress of an AC component in a circuit design and a method of analyzing a degradation of a gate insulation using the same is included in the scope of the present invention. In other words, while embodiments have been described above relative to a hardware implementation, the processing of embodiments may be implemented in software, e.g., by an article of manufacture having a machine-accessible medium including data that, when accessed by a machine, cause the machine to acquire an overshoot voltage.

In embodiments described above, an overshoot voltage through a voltage stress of AC component induced in an actual operation of the circuit may be acquired by using an input voltage input to the designed circuit and an applied time of voltage deviated from a level of the input voltage. The overshoot voltage based on voltage stress of the AC component may be compared with the induced voltage induced between the transistor formation areas, thereby verifying reliability of a gate insulation layer. In addition, a drop in reliability of gate insulation layer may be detected through a reliability simulation after, e.g., immediately after, a circuit design, thereby substantially reducing defects caused after a manufacture completion.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An article of manufacture having a computer readable medium including data that, when accessed by a computer, cause the computer to acquire an overshoot voltage applied to a transistor, the acquiring comprising:
    determining a first extraction value, the first extraction value including a product of acceleration factors determined in a test of the transistor;
    determining an applied time, the applied time corresponding to a length of time a voltage deviates from a predetermined level of an input voltage in a circuit employing the transistor;
    determining a second extraction value by dividing the first extraction value by the applied time; and
    determining the overshoot voltage by multiplying the second extraction value by the input voltage.

2. The article as claimed in claim 1, wherein determining the first extraction value includes determining an area acceleration factor, a temperature acceleration factor, and a voltage acceleration factor of a channel area in the transistor.

3. The article as claimed in claim 2, wherein determining the first extraction value further comprises multiplying the acceleration factors by a predetermined multiplier.

4. The article as claimed in claim 2, further comprising subtracting from the first extraction value a product of a time rating and a guaranteed use time of the transistor, the time rating defining a ratio between a length of application of the input voltage over a lifespan of the transistor and a predetermined lifespan of the transistor.

5. The article as claimed in claim 1, wherein determining the second extraction value includes:
   determining a sum of the applied time and the first extraction value; and
   dividing the determined sum by the applied time.

6. The article as claimed in claim 1, wherein the overshoot voltage is proportional to the (1/N)-th power of the second extraction value.

\* \* \* \* \*